(12) United States Patent
Webb et al.

(10) Patent No.: US 9,490,153 B2
(45) Date of Patent: Nov. 8, 2016

(54) MECHANICAL ALIGNMENT OF SUBSTRATES TO A MASK

(71) Applicant: Varian Semiconductor Equipment Associates, Inc., Gloucester, MA (US)

(72) Inventors: Aaron P. Webb, Austin, TX (US); Charles T. Carlson, Cedar Park, TX (US); Michael Honan, Peabody, MA (US); Luigi G. Amato, Hampton Falls, NH (US); Christopher Neil Grant, Dripping Springs, TX (US); James D. Strassner, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 203 days.

(21) Appl. No.: 14/323,088

(22) Filed: Jul. 3, 2014

(65) Prior Publication Data

US 2015/0026953 A1 Jan. 29, 2015

Related U.S. Application Data

(60) Provisional application No. 61/858,852, filed on Jul. 26, 2013.

(51) Int. Cl.
*C23C 14/04* (2006.01)
*H01L 21/68* (2006.01)

(52) U.S. Cl.
CPC ............. *H01L 21/682* (2013.01); *C23C 14/04* (2013.01); *Y10T 29/49895* (2015.01)

(58) Field of Classification Search
None
See application file for complete search history.

(56) References Cited

U.S. PATENT DOCUMENTS

| | | | | |
|---|---|---|---|---|
| 4,814,830 A | * | 3/1989 | Isohata | ..................... G03F 7/20 355/53 |
| 6,003,828 A | * | 12/1999 | Kawahashi | ............... G03F 1/14 248/576 |
| 6,749,690 B2 | | 6/2004 | Clark | |
| 2002/0102754 A1 | | 8/2002 | Fujimori et al. | |
| 2003/0234919 A1 | * | 12/2003 | Tajima | .................. G03F 7/2014 355/78 |
| 2007/0117028 A1 | * | 5/2007 | Heerens | .............. G03F 7/70741 430/5 |
| 2008/0202421 A1 | | 8/2008 | Allen et al. | |

FOREIGN PATENT DOCUMENTS

JP 62-198863 A 9/1987
JP 11-015143 A 1/1999

OTHER PUBLICATIONS

International Search Report and Written Opinion Mailed Nov. 20, 2014 for PCT/US2014/048183 Filed Jul. 25, 2014.

* cited by examiner

*Primary Examiner* — Charles Capozzi
(74) *Attorney, Agent, or Firm* — Nields, Lemack & Frame, LLC (57) ABSTRACT

A plurality of masks is attached to the underside of a mask frame. This attachment is made such that each mask can independently move relative to the mask frame in three directions. This relative movement allows each mask to adjust its position to align with respective alignment pins disposed on a working surface. In one embodiment, each mask is attached to the mask frame using fasteners, where the fasteners have a shaft with a diameter smaller than the diameter of the mounting hole disposed on the mask. A bias element may be used to allow relative movement between the mask and the mask frame in the vertical direction. Each mask may also have kinematic features to mate with the respective alignment pins on the working surface.

15 Claims, 7 Drawing Sheets

MECHANICAL ALIGNMENT OF SUBSTRATES TO A MASK

This application claims priority of U.S. Provisional Patent Application Ser. No. 61/858,852, filed Jul. 26, 2013, the disclosure of which is incorporated herein by reference in its entirety.

STATEMENT REGARDING FEDERALLY SPONSORED RESEARCH OR DEVELOPMENT

This invention was made with Government support under Contract No. DE-EE0004737 awarded by the Department of Energy. The Government has certain rights in this invention.

FIELD

Embodiments of the present disclosure relate to methods and apparatus for aligning a mask to a substrate during substrate processing, and more particularly, during ion implanting.

BACKGROUND

Semiconductor workpieces are often implanted with dopant species to create a desired conductivity. For example, solar cells may be implanted with a dopant species to create an emitter region. Typically, ions are created by an ion source. The ion source may be a plasma chamber that utilizes RF energy to create ions, or may be an indirectly heated cathode (IHC), or another type of ion source. The ions are extracted from the ion source, and may pass through mass analyzing and focusing components before reaching the workpiece. In some embodiments, the extracted ions are implanted directly in the workpiece and there are no components between the ion source and the workpiece. The workpiece is also disposed on a platen, which holds the workpiece in place.

Often, only portions of a workpiece are implanted. Therefore, a mechanism, such as a mask is inserted between the ion source and the workpiece to block ions from reaching certain portions of the workpiece. This mask may be aligned to the workpiece such that the regions covered by the mask are tightly controlled. In some embodiments, the time needed to align a mask to a workpiece, perform the desired implant, and remove the mask may be excessive.

Therefore, in some embodiments, it may be beneficial to implant a plurality of workpieces at the same time. However, the system and method for installing a plurality of masks over this plurality of workpieces may be expensive and time consuming.

Thus, it would be beneficial if there were a system and method that allowed a plurality of masks to be aligned with a plurality of workpieces, where this alignment was done quickly and inexpensively.

SUMMARY

A plurality of masks is attached to the underside of a mask frame. This attachment is made such that each mask can independently move relative to the mask frame in three directions. This relative movement allows each mask to adjust its position to align with respective alignment pins disposed on a working surface. In one embodiment, each mask is attached to the mask frame using fasteners, where the fasteners have a shaft with a diameter smaller than the diameter of the mounting hole disposed on the mask. A bias element may be used to allow relative movement between the mask and the mask frame in the vertical direction. Each mask may also have kinematic features to mate with the respective alignment pins on the working surface.

In one embodiment, a system for use during workpiece processing is disclosed. The system comprises a mask frame, comprising an upper plate having apertures therein and two or more vertical sidewalls to support the mask frame on a working surface; a plurality of masks, each of the masks comprising a central portion having a pattern and one or more protrusions extending from an edge of the central portion; fasteners passing through mounting holes disposed in the one or more protrusions and connecting to an underside of the upper plate, such that each central portion of the plurality of masks are aligned with a respective aperture in the upper plate; and biasing elements to create a separation force between the underside of the upper plate and each of the masks.

In a second embodiment, a method of aligning a plurality of masks to a plurality of substrates is disclosed. The method comprises positioning a mask frame on a working surface, where the plurality of masks are attached to an underside of the mask frame and each of the masks is positioned above a respective substrate, where each substrate is disposed proximate at least one alignment pin used to align the substrate; aligning each respective mask to a respective alignment pin, where each mask can independently move relative to the mask frame.

In a third embodiment, a system for use during workpiece processing is disclosed. The system comprises a mask frame, comprising an upper plate having apertures therein and two or more vertical sidewalls extending from the upper plate to support the mask frame on a working surface; a plurality of masks, each of the masks comprising a central portion having a pattern; one or more protrusions extending from an edge of the central portion; one or more mounting holes disposed in the one or more protrusions; and one or more kinematic features disposed in the one or more protrusions, each kinematic feature adapted to engage with a respective alignment pin disposed on the working surface; fasteners passing through the mounting holes and connecting to an underside of the upper plate, such that the central portion of each of the masks is aligned with a respective aperture in the upper plate, wherein each of the fasteners comprises a head having a diameter greater than a diameter of the mounting hole and a shaft having a diameter smaller than the diameter of the mounting hole, allowing each of the masks to move relative to the mask frame in two lateral directions.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
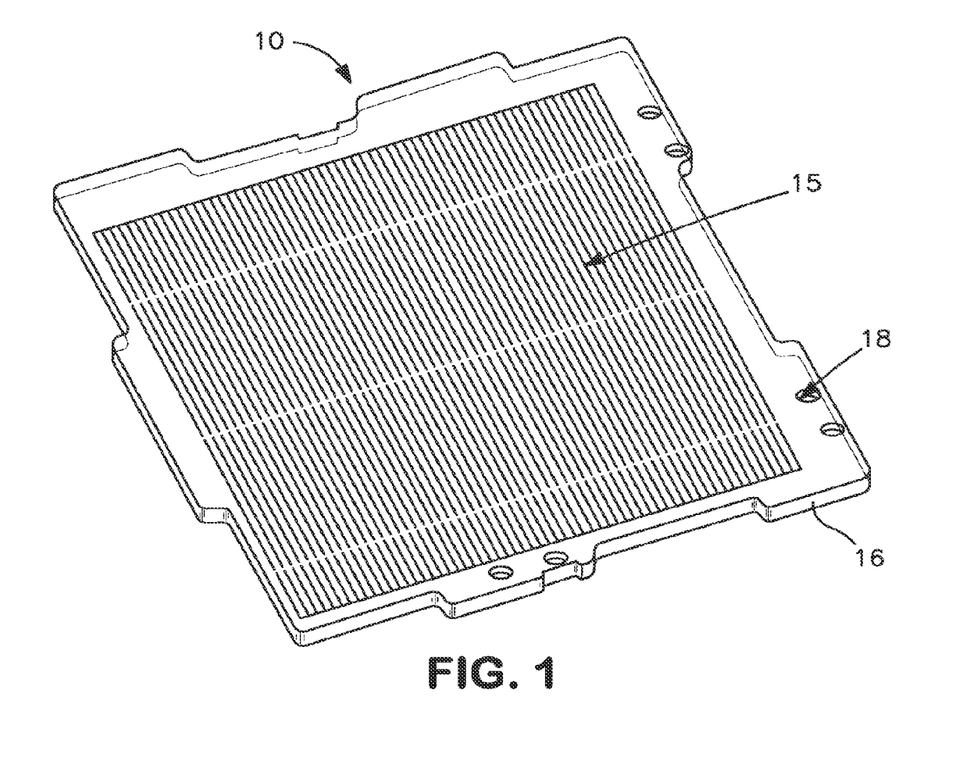
FIG. 1 shows an embodiment of a mask.

FIG. 1 shows a mask that may be used to perform a patterned implant. This mask 10 includes a center portion 15, which is machined to include the desired pattern. Along the edges of the mask 10, one or more protrusions 16 having one or more alignment holes 18 may be disposed. In some embodiments, kinematic joints (not shown) are integrated into the alignment holes 18, such that these joints rest on and align with pins located on the underlying platen. These kinematic joints may be made of silicon carbide. A top surface of the kinematic joints may be v-shaped so as to allow alignment with an alignment pin. These kinematic joints may be effective in creating precise alignment between the mask 10 and the workpiece.

As described above, there are certain situations where the simultaneous implanting of a plurality of workpieces, such as a 4×4 array, may be beneficial. For example, it may be desirous to combine blanket and patterned implanted to achieve speeds in excess of 3000 wafers per hour. However, individual alignment and placement of sixteen masks is time consuming, compromising the main reason for using simultaneous implants.

Figure 2:
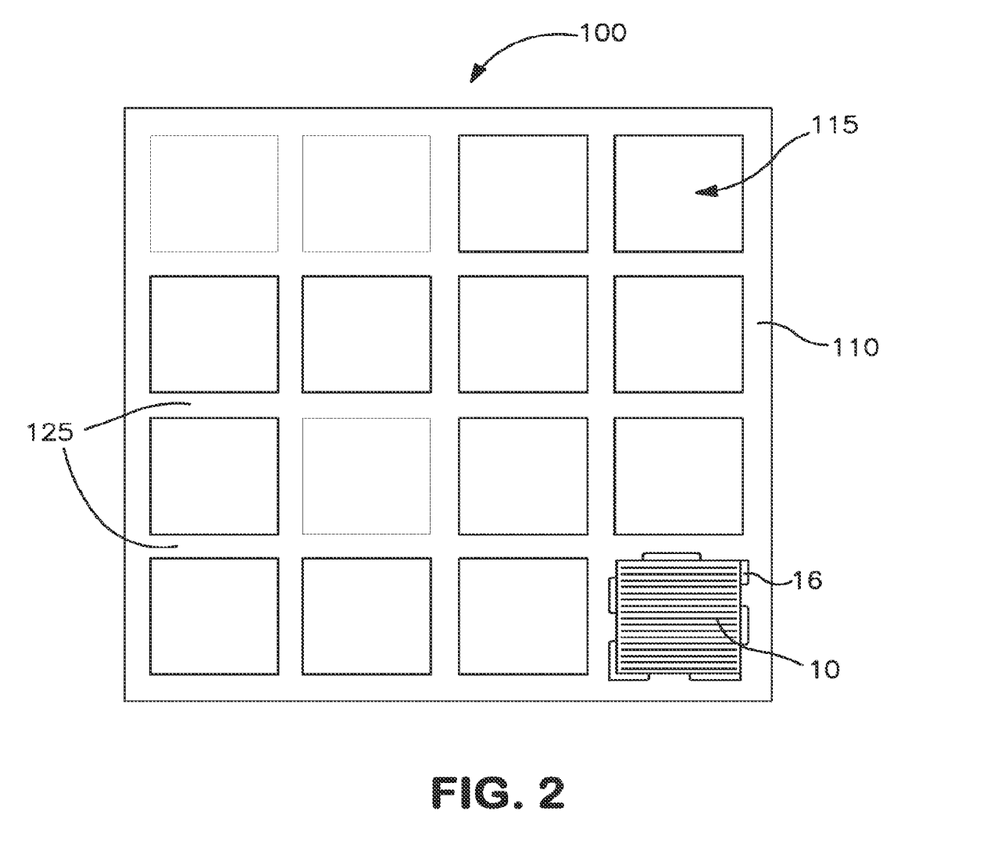
FIG. 2 shows mask frame according to one embodiment.

FIG. 2 shows a mask frame 100, used to hold an array of masks 10. Although the mask frame 100 is shown as capable of holding sixteen masks 10, the mask frame 100 may be of arbitrary size and configured to hold any number of masks 10. The mask frame 100 includes an upper plate 110 having a number of apertures 115 equal to the number of masks 10 that can be supported by the mask frame 100. The apertures 115 are of a size and shape such that the center portion 15 of each of the masks 10 is visible through the aperture 115. The masks are disposed relative to the upper plate 110 such that the protrusions 16 of the masks 10 may be covered by the supports 125 of the upper plate 110.

Figure 3:
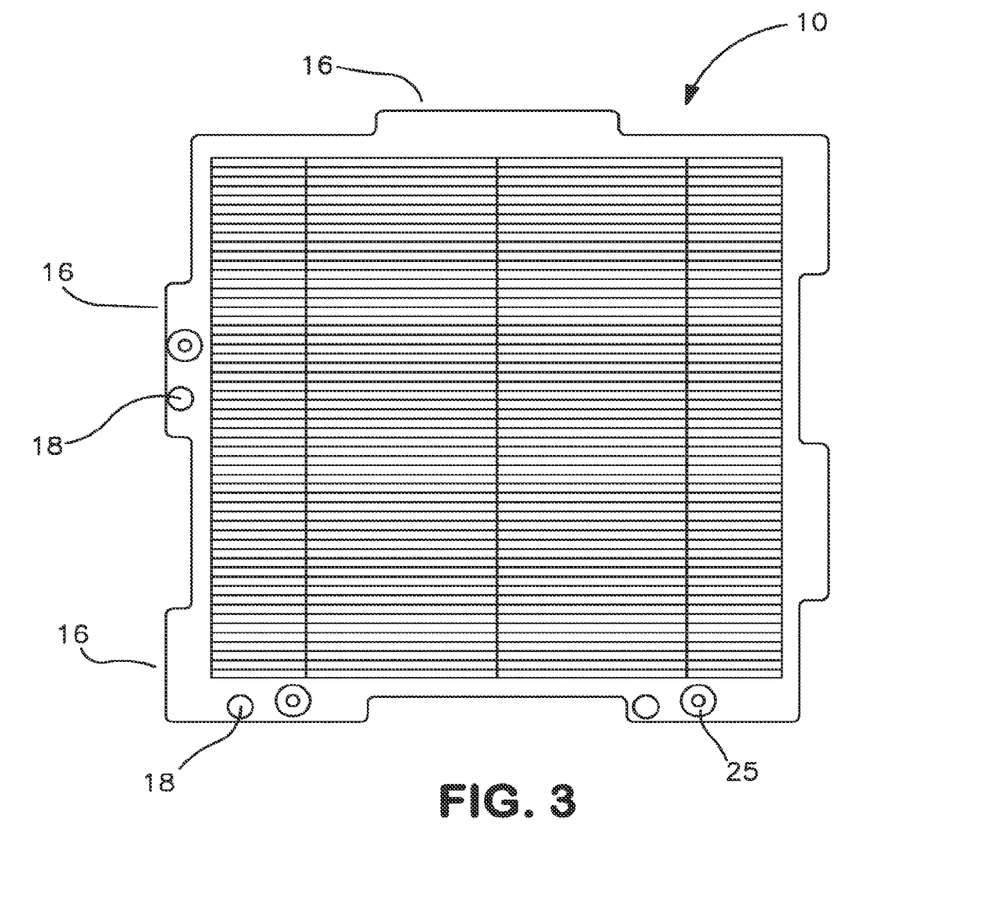
FIG. 3 shows a top view of the mask of FIG. 1.

FIG. 3 shows a top view of the mask 10 shown in FIG. 1. One or more of the protrusions 16 may include alignment holes 18. These alignment holes 18, as described above, may be populated by kinematic features that are used to mate with alignment pins disposed on the platen. In some embodiments, these alignment holes 18 may be disposed on two adjacent sides of the mask 10. In addition, one or more of these protrusions 16 may include mounting holes 25. These mounting holes 25 are used to attach the mask 10 to a mask frame 100, as described in more detail below.

Figure 4:
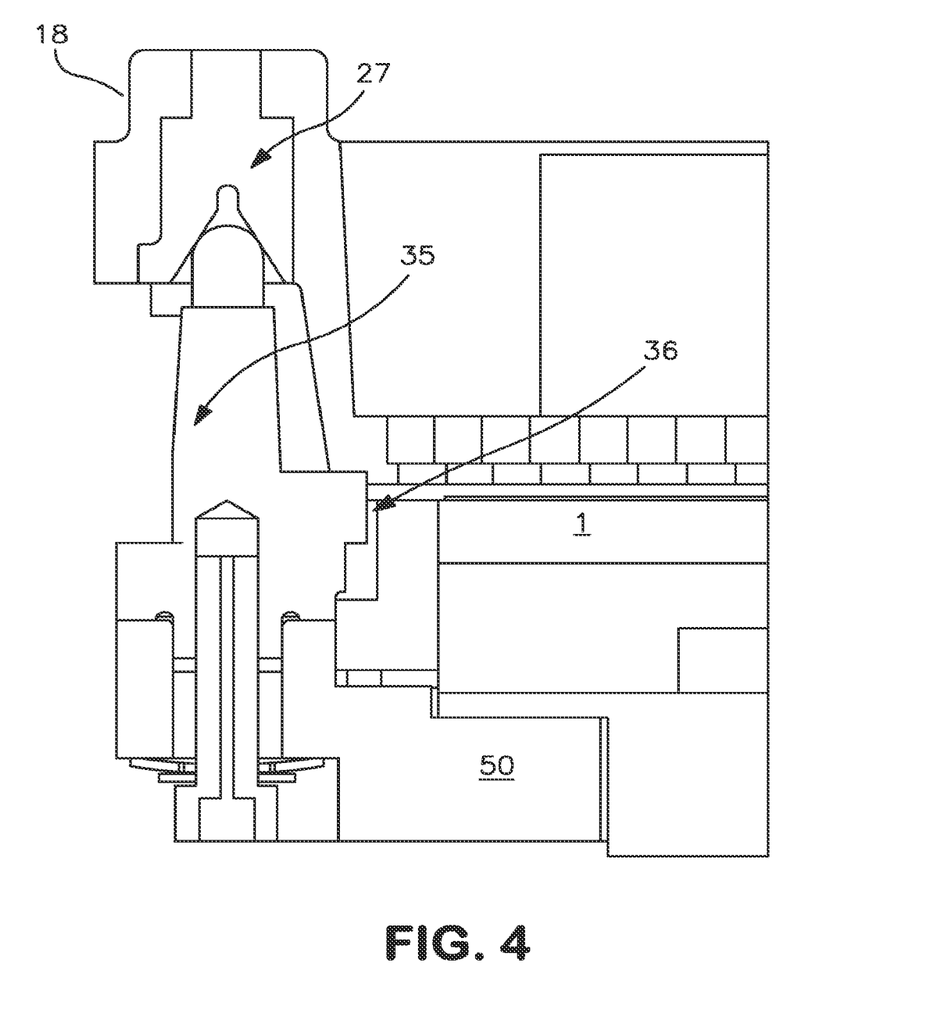
FIG. 4 shows a view of the alignment between a mask, a workpiece and the alignment pin.

FIG. 4 shows a side view of the alignment of the mask 10 to a platen or electrostatic chuck 50. The mask 10 includes an alignment hole 18, populated with a kinematic feature 27. The kinematic feature 27 rests on an alignment pin 35 disposed on the platen or electrostatic chuck 50. The alignment pin 35 may have a ball end on its upper portion which interfaces with the v groove in the kinematic feature 27. The alignment pin 35 also may have a side portion 36, which serves as a hard stop for the workpiece 1. The workpiece 1 may be pushed against the side portion 36, which serves as a lateral alignment feature for the workpiece 1. Thus, the alignment pin 35 serves to align both the workpiece 1 and the mask 10 to a single reference point. This reduces the contributors to tolerance stackup and allows precise alignment to within tens of microns. While FIG. 4 shows a single alignment pin 35, it is understood that each mask 10 may interface with a plurality of alignment pins 35 disposed on the platen or electrostatic chuck 50.

Figure 5:
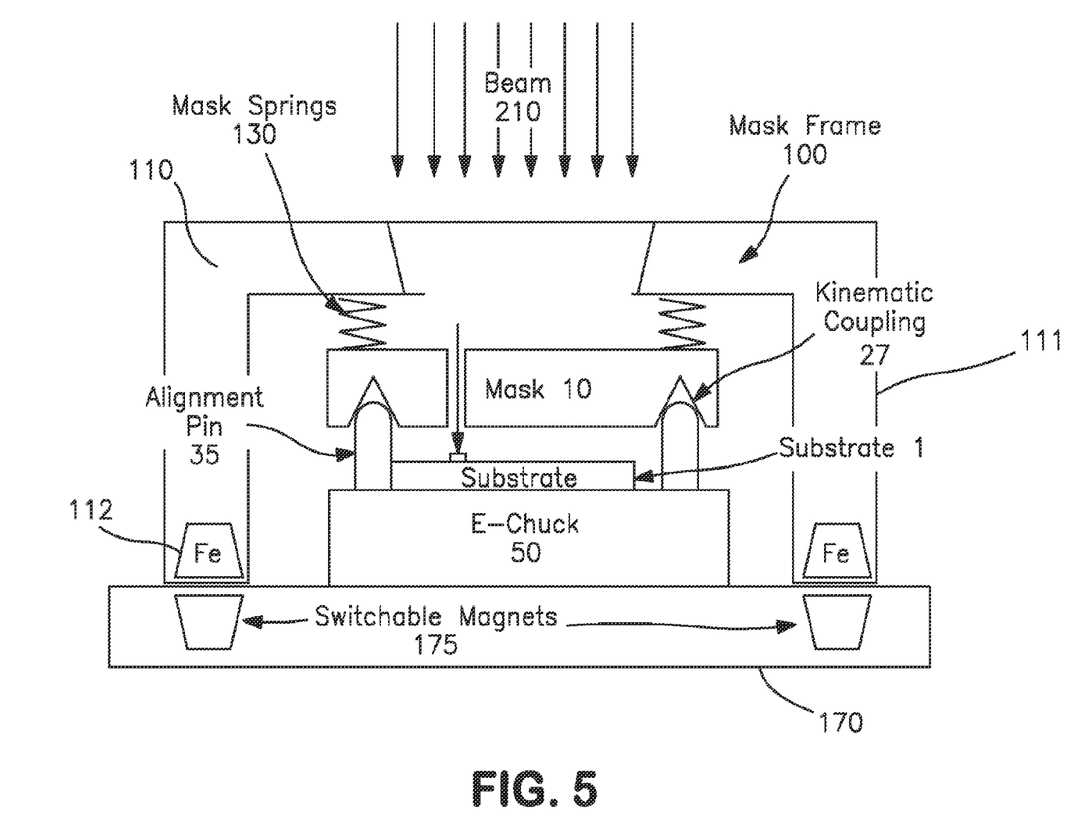
FIG. 5 is side view of a mask frame positioned over a workpiece.

FIG. 5 shows a cross-section of the mask frame 100, mask 10, workpiece 1 and platen or electrostatic chuck 50. The mask frame 100 may have an upper plate 110 as described in FIG. 2. In addition to having an upper plate 110, the mask frame 100 may also have a plurality of vertical side members 111, which extend downward from two or more edges of the upper plate 110. These vertical side members 111 provide the support for the mask frame 100 when it is rests on a working surface 170. These vertical side members 111 are dimensioned so as to allow an electrostatic chuck 50, a workpiece 1, and mask 10 to all be stacked beneath the upper plate 110 of the mask frame 100 without compression. Additionally, these vertical side members 111 may be disposed on all four sides of the mask frame 100. However, in other embodiments, the vertical side members 111 may be disposed only on two opposite sides of the mask frame 100. As shown in FIG. 5, the vertical side members 111 may comprise magnetic material 112 disposed near the distal ends of the vertical side members 111. This magnetic material 112 may be iron, although other materials may also be used. The amount of magnetic material may be selected based on the force needed to hold the mask frame 100 in place during ion implantation or other workpiece processing operations.

Disposed in the working surface 170 may be one or more electrically switchable magnets 175. These electrically switchable magnets 175 may be in communication with a controller (not shown), which is used to supply power to the electrically switchable magnets 175 to change their states from active, or magnetic, to inactive, or inert. Thus, before the mask frame 100 is laid on the working surface 170, the electrically switchable magnets 175 may be in their inactive state. After the mask frame 100 has been properly aligned, the electrically switchable magnets 175 may be switched to their active or magnetic state to hold the mask frame 100 in place. When the mask frame 100 is to be removed, the electrically switchable magnets 175 are switched to their inactive state, and the mask frame 100 is removed.

While FIG. 5 shows a configuration having electrically switchable magnets 175 and magnetic materials 112, other mechanisms can be used to hold the mask frame 100 to the working surface 170. For example, mechanical retainers, such as hooks or latches, may be used to hold the mask frame 100 in place. Thus, the mask frame 100 and working surface 170 may include a retention feature, which may be magnetic, mechanical or electrical in nature.

On the working surface 170 may be disposed one or more platens or electrostatic chucks 50. As described above, these platens may each include one or more alignment pins 35, which are used to align both the workpiece 1 and the mask 10. The mask 10 may include kinematic features 27 to align with the ball end of the alignment pins 35. While only one electrostatic chuck 50 is shown, it is understood that a plurality of electrostatic chucks 50 may be disposed on the working surface 170 and covered by the mask frame 100. As stated earlier, in one embodiment, there are sixteen electrostatic chucks 50, arranged in a 4×4 array.

Figure 6:
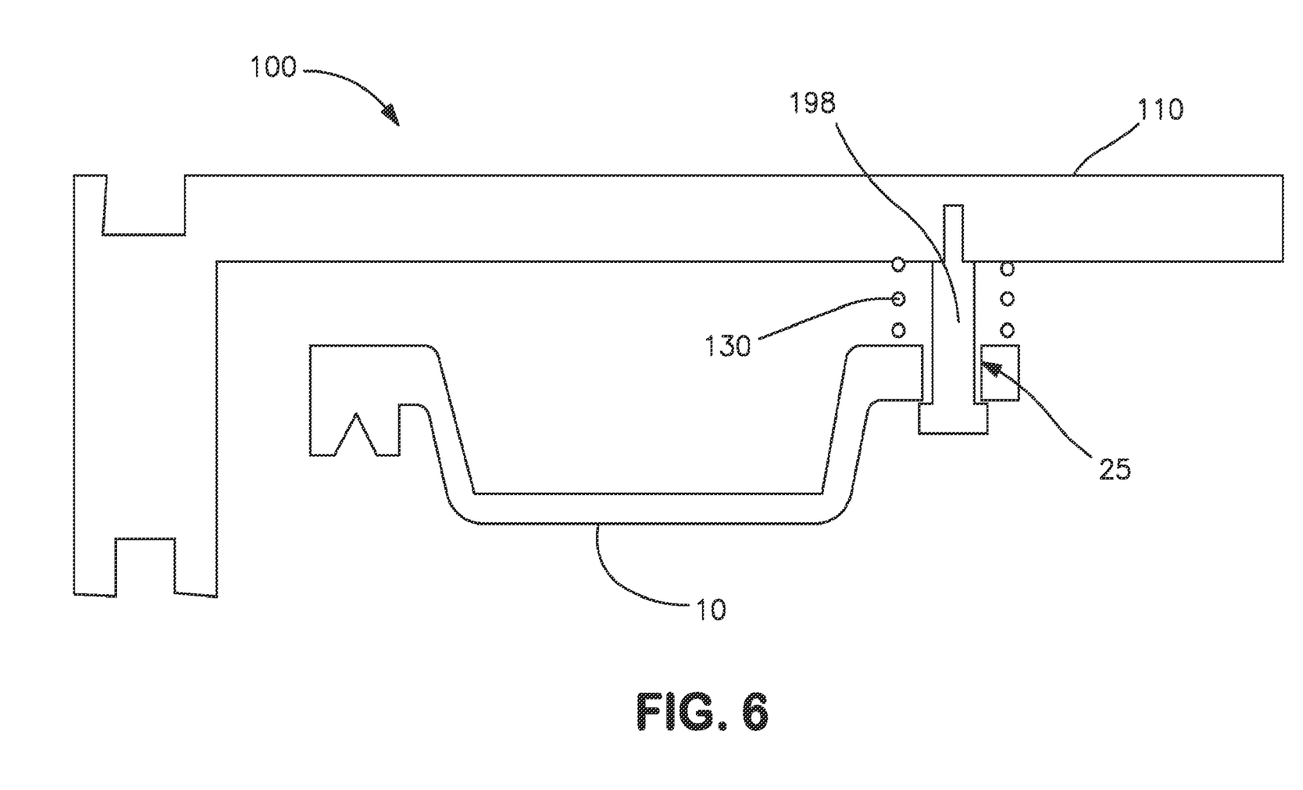
FIG. 6 shows a mask frame with a mask attached thereto.

The masks 10 are secured to the underside of the upper plate 110, such as by screws or other mechanical fasteners, as shown in more detail in FIG. 6. In addition, biasing elements 130, such as springs, are used to create a separation force between the upper plate 110 and the masks 10. This separation force insures that the masks 10 are securely positioned on the alignment pins 35. With the proper spring sizing and clearances, an array of masks 10 are able to couple to an array of electrostatic chucks 50, even with the tolerance stackups that may be present when building such a complex assembly.

Additionally, the components shown in FIG. 5 may expand due to the heat generated by the incoming ion beam 210. These components may expand at different rates, due to differences in their respective coefficients of thermal expansion, and the amount of heat that they receive. The biasing elements 130 provide the necessary positional movement to insure that each mask 10 will properly mate to its kinematic feature 27 and each mask 10 will align to its respective electrostatic chuck 50.

FIG. 6 shows a side view of a mask frame 100 and a single mask 10. As described above, the mask frame 100 may support any number of masks 10. As shown, the masks 10 are attached to the lower surface of the upper plate 110. This attachment may be made using a screw 198 or other fastener. The screw 198 may be screwed into the underside of the upper plate 110. The head of the screw 198 is dimensioned so as to be larger than the diameter of the mounting hole 25, so as to create a vertical stop. Thus, the mask 10 can move vertically relative to the mask frame 100, since the screw is not fixed to the mask 10. The diameter of the mounting hole 25 is larger than the diameter of the shaft of the screw 198. This small difference in size allows the mask 10 to move laterally (i.e. in X and Y directions, orthogonal to the vertical direction) relative to the mask frame 100. This small difference allows the mask 10 to move slightly relative to the mask frame 100, such as may occur due to thermal expansion. In addition, this small difference allows the mask 10 to move laterally in order to properly align with the alignment pins 35 of the respective electrostatic chucks 50. In some embodiments, the difference between the diameter of the mounting hole 25 and the diameter of the shaft of the screw 198 may allow the mask 10 to move about 0.040 inches in the XY plane.

In addition, a biasing element 130, such as a spring is disposed between the underside of the upper plate 110 and the top surface of the mask 10, such as around the screw 198. This biasing element 130 urges the mask 10 downward, away from the upper plate 110. However, the biasing element 130 is compressible, allowing the mask 10 to move in the vertical direction relative to the upper plate 110.

Figure 7:
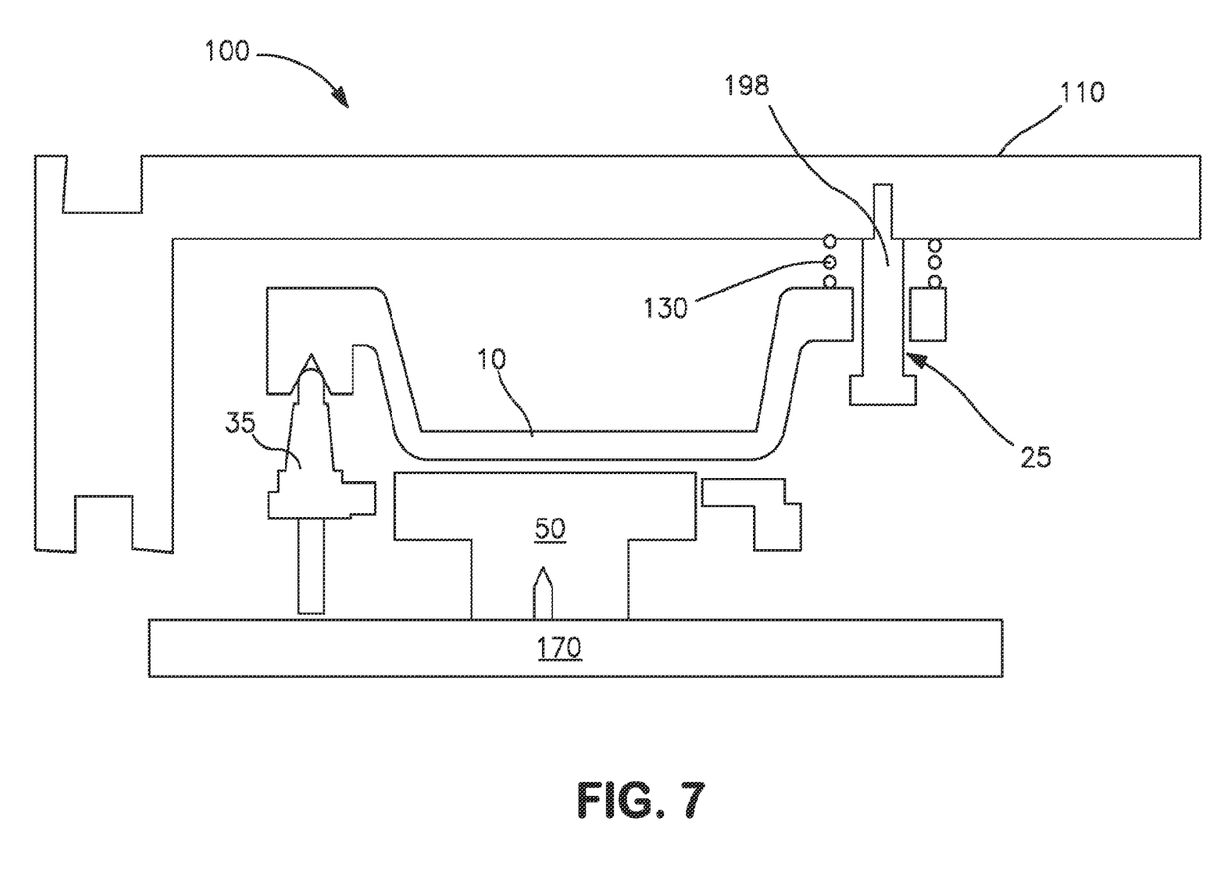
FIG. 7 is a side view of the connection between the mask frame and the mask according to one embodiment.

FIG. 7 shows the mask frame 100 and mask 10 of FIG. 6 engaged with an alignment pin 35. Again, although only one mask 10 is shown, it is understood that multiple masks 10 can be supported by a mask frame 100. In addition, although only one alignment pin 35 is shown, it is understood that each mask 10 may be supported by any number of alignment pins. For example, FIG. 3 shows alignment holes 18 to house three kinematic joints. In addition, although only one screw 198 and mounting hole 25 are shown, it is understood that the mask can be attached to the mask frame using any number of screws 198. For example, FIG. 3 shows a mask having three mounting holes 25. Furthermore, although FIG. 3 shows the mounting holes 25 disposed near the alignment holes 18, in other embodiments, these holes may be disposed on different protrusions 16.

Returning to FIG. 7, it can be seen that due to the interaction between the mask 10 and the alignment pin 35, the biasing element 130 may be compressed. The use of a screw 198 and a biasing element 130 allows the mask to move as much as about 0.100 inches in the vertical direction relative to the mask frame 100. In addition, the mask 10 may also move laterally relative to the upper plate 110, as described above. This ability for the mask 10 to move in all three dimensions relative to the mask frame 100 allows each of the masks 10 to align to its respective alignment pins 35 and allows the masks 10 to compensate for thermal expansion as well. In addition, due to the mechanism used to attach the masks 10 to the mask frame 100, each mask 10 may move independent of every other mask 10. For example, one mask 10 may align itself to the underlying alignment pins 35 by moving slightly to the left, while another mask 10 may align itself by moving slightly to the right.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for use during workpiece processing, comprising:
   a mask frame, comprising:
      an upper plate having apertures therein; and
      two or more vertical sidewalls to support said mask frame on a working surface;
   a plurality of masks, each of the masks comprising:
      a central portion having a pattern; and
      one or more protrusions extending from an edge of said central portion;
   fasteners passing through mounting holes disposed in said one or more protrusions and connecting to an underside of said upper plate, such that each central portion of said plurality of masks are aligned with a respective aperture in said upper plate; and
   biasing elements to create a separation force between said underside of said upper plate and each of said masks.

2. The system of claim 1, wherein said mounting hole has a diameter, and each of said fasteners has a head and a shaft, where the head of each of said fasteners has a diameter greater than the diameter of the mounting hole and the shaft has a diameter smaller than the diameter of the mounting hole, allowing relative movement between the mask and the mask frame.

3. The system of claim 2, wherein said biasing elements comprise springs disposed around said shafts and positioned between said underside of said upper plate and said masks.

4. The system of claim 1, wherein each of said masks further comprises alignment holes disposed on one or more of said protrusions, adapted to mate with respective alignment pins disposed on said working surface.

5. The system of claim 4, wherein said alignment holes and said mounting holes are disposed on the same protrusions.

6. The system of claim 4, wherein said alignment holes and said mounting holes are disposed on different protrusions.

7. The system of claim 1, further comprising a retention feature disposed on said vertical sidewalls to hold said mask frame on said working surface.

8. The system of claim 7, wherein said retention feature comprises a magnetic material disposed in a distal end of said vertical sidewalls and an electrically switchable magnet disposed in said working surface.

9. The system of claim 1, wherein said mask frame comprises supports disposed between said apertures, wherein said protrusions are disposed beneath said supports and said fasteners connect to said supports.

10. A system for use during workpiece processing, comprising:
- a mask frame, comprising:
  - an upper plate having apertures therein; and
  - two or more vertical sidewalls extending from said upper plate to support said mask frame on a working surface;
- a plurality of masks, each of the masks comprising:
  - a central portion having a pattern;
  - one or more protrusions extending from an edge of said central portion;
  - one or more mounting holes disposed in said one or more protrusions; and
  - one or more kinematic features disposed in said one or more protrusions, each kinematic feature adapted to engage with a respective alignment pin disposed on said working surface;
- fasteners passing through said mounting holes and connecting to an underside of said upper plate, such that the central portion of each of said masks is aligned with a respective aperture in said upper plate, wherein each of said fasteners comprises a head having a diameter greater than a diameter of said mounting hole and a shaft having a diameter smaller than said diameter of said mounting hole, allowing each of said masks to move relative to said mask frame in two lateral directions.

11. The system of claim 10, further comprising a plurality of biasing elements, each disposed on a respective shaft of said fasteners, located between an underside of said mask frame and one of said masks, to create a separation force between said upper plate and said mask and to allow relative movement between said mask and said mask frame in a vertical direction.

12. The system of claim 10, wherein said kinematic features and said mounting holes are disposed on the same protrusions.

13. The system of claim 10, wherein said kinematic features and said mounting holes are disposed on different protrusions.

14. The system of claim 10, further comprising a retention feature disposed on said vertical sidewalls to hold said mask frame on said working surface.

15. The system of claim 14, wherein said retention feature comprises a magnetic material disposed in a distal end of said vertical sidewalls and an electrically switchable magnet disposed in said working surface.

* * * * *